United States Patent
Patil et al.

(10) Patent No.: US 8,228,745 B2
(45) Date of Patent: Jul. 24, 2012

(54) TWO STAGE VOLTAGE LEVEL SHIFTING

(75) Inventors: Sanjay Bhagwan Patil, Austin, TX (US); Valentina Gomez, Austin, TX (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 12/805,147

(22) Filed: Jul. 14, 2010

(65) Prior Publication Data
US 2012/0014192 A1      Jan. 19, 2012

(51) Int. Cl.
*G11C 7/00* (2006.01)

(52) U.S. Cl. .................... 365/189.11; 365/226; 365/227

(58) Field of Classification Search ............. 365/189.11, 365/226, 227
See application file for complete search history.

(56) References Cited

U.S. PATENT DOCUMENTS

| | | |
|---|---|---|
| 2009/0085644 A1 | 4/2009 | Roth et al. |
| 2010/0008162 A1* | 1/2010 | Do ........................ 365/189.11 |
| 2011/0149661 A1 | 6/2011 | Rajwani et al. |

OTHER PUBLICATIONS

UK Search Report dated Oct. 22, 2011 in GB 1110958.4.

* cited by examiner

*Primary Examiner* — Huan Hoang
(74) *Attorney, Agent, or Firm* — Nixon & Vanderhye P.C.

(57) ABSTRACT

A voltage level shifter for shifting an output signal from a first voltage level to a second voltage level and then to a further boosted second voltage level is disclosed. The voltage level shifter comprises: an input for receiving an input signal; an output for outputting an output signal; a first power supply input for connecting to a first voltage source supplying said first voltage level; a second power supply input for connecting to a second voltage source supplying said second voltage level; and a third power supply input for connecting to a third voltage source supplying said boosted second voltage level; said voltage level shifter being responsive to a predetermined change in said input signal to isolate said first power supply input from said output and to connect said second power supply input to said output and being responsive to said output signal attaining a predetermined value to connect said third power supply input to said output and to isolate said second power supply input from said output.

15 Claims, 8 Drawing Sheets

TWO STAGE VOLTAGE LEVEL SHIFTING

BACKGROUND OF THE INVENTION

1. Field of the Invention

The field of the invention relates to semiconductor circuits and in particular, to voltage level shifters for switching between a first value and a boosted second value.

2. Description of the Prior Art

Circuits that can switch from a first voltage level to a boosted second voltage level are known. For example in the field of power gating circuits to reduce power consumption during periods of no activity, it is known to provide header or footer devices that gate the power supply to processing circuitry. These devices take the form of transistors that lie between one of the power rails and the processing circuitry and are turned on or off by a control signal applied to their gates. When they are off, there is still some leakage current that flows through the transistor and then through the processing circuitry and this leakage current increases the power consumption of the device without providing any benefit. This problem has been recognised and one solution has been to provide a gate bias voltage that biases the voltage applied to the gate beyond the supply voltage resulting in a state that is sometimes referred to as a super cutoff state. In this state the leakage current through the transistor is significantly reduced.

A problem with such a system is that an additional power supply is required to supply this bias voltage. This power supply can be provided by an on chip voltage regulator to generate a boosted core supply or by a charge pump. In order to reduce the size requirements of such devices it is desirable to keep the current rating of these devices small. A low current also reduces the grid requirements associated with the supply, that is the size of the connections required to distribute current from the supply to the required nodes. However, restricting the amount of current that such devices can supply can affect the performance of the system by slowing down the time taken for some transitions.

It would be desirable to be able to provide a boosted voltage level without a large additional hardware requirement.

SUMMARY OF THE INVENTION

A first aspect of the present invention provides a voltage level shifter for shifting an output signal from a first voltage level to a second voltage level and then to a further boosted second voltage level, said voltage level shifter comprising: an input for receiving an input signal; an output for outputting an output signal a first power supply input for connecting to a first voltage source supplying said first voltage level; a second power supply input for connecting to a second voltage source supplying said second voltage level; and a third power supply input for connecting to a third voltage source supplying said boosted second voltage level; said voltage level shifter being responsive to a predetermined change in said input signal to isolate said first power supply input from said output and to connect said second power supply input to said output and being responsive to said output signal attaining a predetermined value to connect said third power supply input to said output and to isolate said second power supply input from said output.

The present invention recognises the competing requirements of speed of performance, reduced current leakage and size of hardware. It addresses the problems of providing a boosted voltage level while restricting the capacity of the additional voltage supply required for this boosted voltage level. It does this by recognising that in circuitry requiring such a voltage level shifter there will be a voltage supply and supply grid of a significant size that provides the second voltage level as this voltage level is the voltage level used as a power supply to supply power to the circuitry. The present invention takes advantage of the presence of this supply and grid to provide the required current to attain the transition from the first voltage to a predetermined voltage level and only when this level is reached does it switch to connect to the boosted voltage level supply.

Thus, in this way the boosted voltage level supply need only supply current for the transition from the predetermined level to the boosted second voltage level and thus, the current requirements of the device are significantly less than would have been the case had this supply been used to power the whole transition.

The provision of a two stage voltage level shift to a first predetermined level and then to the final boosted second voltage level requires additional switching to control the connections to the different voltage level supplies. Generally in such circuits additional switches are avoided where possible as they increase the size of the device and decrease performance as any additional switching will increase latency. However, the present invention recognises that the advantages associated with the reduction in the boosted voltage supply and grid requirements outweigh the additional switching requirements associated with the voltage level shifter of the invention.

In some embodiments, said predetermined value is substantially equal to said second voltage level.

Although the voltage level shifter can be designed so that the powering of the change of the output voltage from the first level to the boosted second level switches from the second voltage source to the third voltage source at any value lying between the first and second voltage level, in some embodiments it is configured such that it switches when the predetermined value is substantially equal to the second voltage level. Clearly the second voltage source can supply a voltage level up to the second voltage level and as this needs to be a large voltage source if it is to be used to supply power to the circuitry and will generally have an associated high capacity supply grid then using this voltage source and supply grid for as long as possible during the transition from one voltage level to the next is advantageous.

A further advantage of such an arrangement is that although the boosted voltage may increase the performance of the device it may not be essential for its operation and thus, using the second voltage supply and grid to attain the second voltage level means that were the third voltage supply or grid to fail the device would still in many cases function reliably albeit with a reduced performance.

In some embodiments, said voltage level shifter comprises an inverter such that said predetermined change in said input voltage triggering said output changing from said first voltage level to said second boosted voltage level comprises an input signal change from said second voltage level to said first voltage level.

Although the voltage level shifter can have a number of forms, it can conveniently be an inverter. Level Shifters may in some cases be non-inverting to preserve logical equivalency from input to output. However, if there is no requirement for input to output logical equivalency a one stage (i.e. inverting) level shifter may be preferred to reduce logic stages and leakage from the always on supply.

In some embodiments, said voltage level shifter comprises: a first switch responsive to a first value of said input signal to connect said output to said first power supply input and responsive to a second value of said input signal to isolate said output from said first power supply input; a second switch responsive to a second value of said input signal to connect said output to said second power supply input and responsive to said first value of said input signal to isolate said second power supply input from said output; and further switches responsive to said output signal attaining said predetermined value to connect said third power supply input to said output, said further switches forming a portion of a feedback path for supplying a signal to control said second switch by overriding said second value supplied to said second switch such that said second switch is controlled to isolate said output signal from said second power supply input in response to said output signal attaining said predetermined value.

One way of forming the voltage level shifter is from a plurality of switches that are configured to switch in response to the input signal changing value and the output signal attaining the predetermined value. The further switches that connect the output to the third voltage source when the output value reaches the predetermined value are arranged to also provide a feedback route to ensure that at this point the switch connecting the second voltage source to the output is isolated from the output so that there is no route via which the third voltage source and the second voltage source are connected.

In some embodiments, said second switch is substantially larger than any one of said further switches.

By allowing the transition from the first to the predetermined voltage level to be powered by the second voltage supply via the second switch this switch can be large and can therefore carry a lot of current and enable this transition to be quick. The further switches that control the later transition can be made to be smaller and carry less current and although this means that the later transition is slower this is not important as important as the circuit will function correctly once the transition to the second voltage level has been attained. Thus, provided the predetermined voltage level is quite close to the second voltage level, any delay in the later switching will not impact operational performance much, but only increase leakage currents slightly.

In some embodiments, said further switches are configured such that a rate of change of said output voltage level from said predetermined value to said second boosted voltage level is lower than a rate of change of said output voltage level from said first voltage level to said predetermined value.

As noted above the size of the further switches affects the rate of change of the output voltage level from the predetermined value to the boosted second voltage level. Thus, smaller further switches can be selected where appropriate and where this rate of change of voltage level can be allowed to be slow.

In some embodiments, said voltage level shifter comprises a tristate voltage level shifter, said tristate voltage level shifter being configured to output three different output signals, a high impedance tristate output signal isolating said input signal from said output signal, said first voltage level and said second boosted voltage level, said voltage level shifter comprising a further input for receiving a tristate control signal, said voltage level shifter being responsive to said tristate control signal having a predetermined value to generate said tristate output signal by isolating said input from said output.

The voltage level shifter may be a tristate voltage level shifter with a further tristate output in which state the input is isolated from the output. This can be advantageous in some embodiments such as where the voltage level shifter is controlling power control switches that also have a retention mode. This will be descried later.

A second aspect of the present invention provides an apparatus comprising at least one voltage level shifter according to a first aspect of the present invention, said apparatus further comprising: first, second and third voltage supplies configured to supply said first voltage level, said second voltage level and said boosted second voltage level respectively; circuitry powered by a voltage difference between said first and second voltage supplies; wherein said third voltage supply is configured to supply said second boosted voltage level as a biasing voltage level via said at least one voltage level shifter to at least one component within said apparatus; wherein said third voltage supply is a small voltage supply compared to at least one of said first and said second voltage supply.

Where circuitry is powered by a voltage difference between the first and second voltage level, then these voltage level supplies and their supply grids must perforce be large. Taking advantage of this and allowing much of the transition from the first level to the boosted second level to be powered by the second voltage supply means that an apparatus having a small third voltage supply can be provided and the additional area required by this voltage supply is reduced as compared to a system where the third voltage supply is as large as one of the other voltage supplies.

In some embodiments, said apparatus comprises a data processing apparatus comprising processing circuitry powered by a voltage difference between said first and second voltage supplies and further comprising: at least one power control switch arranged between one of said first and second voltage supplies and said processing circuitry, said at least one power control switch being controlled by said output signal from said at least one voltage level shifter, said at least one power control switch being responsive to said at least one voltage level shifter outputting: said first voltage level to connect said one of said first and second voltage supplies to said processing circuit; said second voltage level to isolate said one of said first and second voltage supplies from said processing circuit; and said boosted second voltage level to isolate said one of said first and second voltage supplies from said processing circuit and provide a reduced leakage current through said power control switches.

A supply of a boosted voltage level is particularly convenient in apparatus having power control switches as this boosted voltage level can be used to ensure that these power switches are not just turned off but have a reduced leakage current as they are in what can be termed as super cut off state.

In some embodiments, said at least one voltage level shifter comprises a tristate voltage level shifter; said tristate voltage level shifter being configured to output three different output signals, a high impedance tristate output signal isolating said input signal from said output signal, said first voltage level and said second boosted voltage level, said voltage level shifter comprising a further input for receiving a tristate control signal; said tristate voltage level shifter being responsive to said tristate control signal having a predetermined value to generate said tristate output signal by isolating said input from said output; said data processing apparatus further comprising: a retention mode switch controlled by said tristate control signal and connected between an output of said at least one power control switch and a control input of said at least one power control switch, wherein in response to said tristate control signal having said predetermined value, said tristate voltage level shifter outputs said high impedance tristate output and said tristate switch is turned on such that said output of said at least one power control switch is connected to said control input and a portion of said voltage different supplied to said processing circuitry drops across said at least one power control switch.

For apparatus having a retention state, the tristate voltage level shifter is convenient as it can provide a high impedance output which isolates the data input from the input to the power control switches and allows the voltage level of this input to be controlled without interference from the input to the voltage level shifter.

In some embodiments, said data processing apparatus comprises a SCMOS apparatus. This is a MOS apparatus with a super cut off state, i.e. one where when the voltage level of the control input of the switch is a boosted voltage level it enters a super cut off state and the leakage currents are reduced.

In some embodiments, said apparatus comprises a semiconductor memory storage device comprising: a plurality of storage cells for storing data; at least two access control lines each for controlling access to at least one of said plurality of storage cells; wherein in response to an access control signal indicating a selected cell to be accessed, said at least one voltage level shifter is controlled to output said boosted second voltage level to one of said access control lines to provide a boost to a voltage level on said access control line.

A further case where embodiments of the present invention are particularly useful is in semiconductor memory storage devices where the boosted voltage level can be used to boost the access control line voltage which can be useful when writing to a semiconductor memory as it enables the storage cells to switch values. Storage cells in memories are designed with competing requirements. They must be able to retain their stored values and yet must also be able to switch value when written too. Thus, providing a boost to the access control line during a write is a convenient way of ensuring that stable cells can still switch values when required. As noted previously this is a convenient and area efficient way of providing this boosted voltage level.

A third aspect of the present invention provides a method of shifting an output signal from a first voltage level to a second voltage level and then voltage shifting said output signal to a further boosted second voltage level, said method comprising the steps of: connecting a first voltage source supplying said first voltage level to a first power supply input; connecting a second voltage source supplying said second voltage level to a second power supply input; and connecting a third voltage source supplying said boosted second voltage level to a third power supply input; receiving an input signal having a first value; in response to receipt of said input signal, connecting said first voltage source to an output to generate said output signal; receiving an input signal that changes from said first value to a second value; in response to said change: isolating said first power supply input from said output; connecting said second power supply input to said output; and in response to said output signal attaining a predetermined value: connecting said third power supply input to said output and isolating said second power supply input from said output.

A fourth aspect of the present invention provides a voltage shifting means for shifting an output signal from a first voltage level to a second voltage level and then to a further boosted second voltage level, said voltage shifting means comprising: an input means for receiving an input signal; an output means for outputting an output signal; a first power supply input means for connecting to a first voltage source supplying said first voltage level; a second power supply input means for connecting to a second voltage source supplying said second voltage level; and a third power supply input means for connecting to a third voltage source supplying said boosted second voltage level; said voltage shifting means being for isolating said first voltage source from said output and for connecting said second power supply input means to said output in response to a predetermined change in said input signal and for connecting said third power supply input means to said output means and for isolating said second power supply input means from said output means in response to said output signal attaining a predetermined value.

A fifth aspect of the present invention provides an apparatus comprising at least one voltage shifting means according to a fourth aspect of the present invention, said apparatus further comprising: three means for supplying voltage, a first means for supplying said first voltage level, a second means for supplying said second voltage level and a third means for supplying said boosted second voltage level; circuitry powered by a voltage difference between said first and second means; wherein said third means is for supplying said second boosted voltage level as a biasing voltage level via said at least one voltage shifting means to at least one component within said apparatus; wherein said third means is small compared to at least one of said first and said second means.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
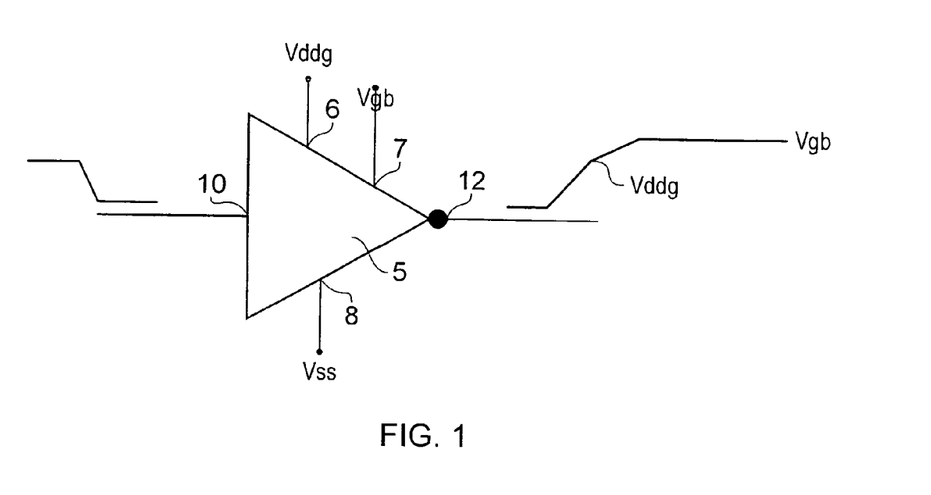
FIG. 1 shows an inverter for providing a boosted output voltage according to an embodiment of the present invention.

FIG. 1 shows schematically an inverter 5 according to an embodiment of the present invention that is configured to provide a boosted output voltage VGB in response to an input signal changing. Inverter 5 has a power supply input 6 for receiving VDDG which is the voltage level of the high power rail of the circuit, a power supply input 7 which receives the voltage from a boosted voltage source VGB which is a higher voltage level than that of the high voltage rail and a power supply input 8 which receives the low voltage level VSS.

Inverter 5 has an input 10 and an output 12 and in response to the input signal being high the inverter outputs a low output signal. When the input signal falls low then the inverter output level rises. Initially it rises to the level of VDDG and then it rises higher to the boosted VGB level. As can be seen schematically in this figure the rise from the low level to VDDG occurs at one rate while the rise from VDDG to VGB occurs more slowly. The rate at which these levels rise depends on the sizing of the devices within inverter 5. The rise to the level of VDDG affects the timing of the circuit and thus, should be fast, while the rise to the additional biased voltage simply reduces leakage currents and thus, this level not being attained very quickly is not so important. Thus, it may be advantageous to allow the rise in voltage level from VDDG to VGB to occur more slowly and use smaller components thereby saving area.

Figure 2:
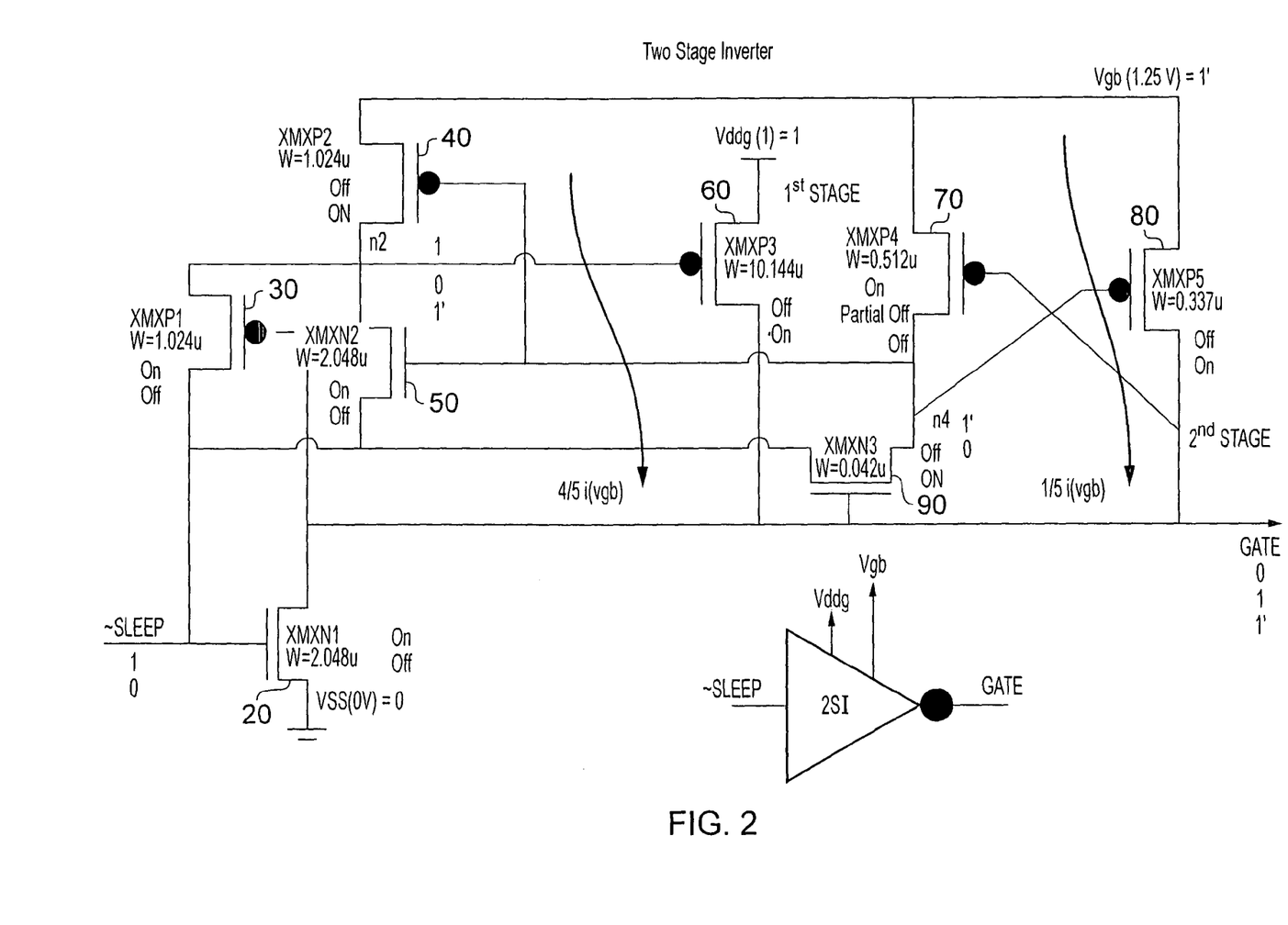
FIG. 2 shows the inverter of FIG. 1 in circuit form.

FIG. 2 shows a circuit diagram illustrating the inverter 5 of an embodiment of the present invention. In this embodiment the input signal is shown as changing from a 1 to 0 and the various states of the transistors are shown as changing in response to this. The input signal is designated as a sleep signal as this inverter is to be used to control the power transistors of a circuit such that in this case as they are PMOS transistors when the sleep signal goes low and the output rises it turns them off and the circuit enters low power mode. A boost to the output voltage makes sure that these power transistors are in the super cut off state during this low power mode and their leakage current is therefore reduced.

In this embodiment we have various transistors 20, 30, 40, 50, 60, 70, 80 and 90, which act to control the connection of the high voltage line Vddg and the boosted high voltage Vgb to the output.

Operation of this circuit occurs as follows. When the input signal is high transistor 20 is on and a low signal is output at the output. This low signal turns transistor 30 on and a high signal is transmitted to node n2 such that a 1 appears at this node. This turns transistor 60 off and isolates the output from the power supply Vddg. The 1 at the input and the 0 at the output mean that transistor 90 is off. However, the 0 at the output turns transistor 70 on and the 1' is transmitted through transistor 70 to node n4 and turns transistor 80 off. This isolates the bias gate voltage 1' from the output. The 0 at the output turns transistor 70 on but as transistor 90 is off the 1' does not get transmitted any further.

When the input signal falls to a 0 then this turns transistor 20 off and isolates the output from VSS. Initially the 0 that was previously output means that transistor 30 is still on and thus, the 0 at the input is transmitted to node n2 and this falls to 0. This turns transistor 60 on and current from the power supply Vddg is sent through transistor 60 and raises the output level to 1. Transistor 60 is a large transistor with a low impedance and can thus, transmit a high current and the transition at the output from 0 to 1 is fast. As the output reaches 1, transistor 90 is turned on and the 0 at the input is transmitted through transistor 90 to the gate of transistor 80 and this turns this on. This means that the output voltage rises from 1 to 1'. This rise in voltage level being supplied by the boosted voltage source Vgb. When the output is at 1 before the boost there is a 1 at the input to transistor 70 but a 1' at its source meaning that it is only partially off. The 1 that is transmitted through transistor 90 goes to transistor 50 and turns this off and turns transistor 40 on. This means that the 0 that was at n2 rises to 1' through transistor 40 and this turns transistor 60 off. The 1' at the output is also transmitted to the gate of transistor 70 and turns this off completely. Thus, as can be seen once the output level reaches the level of the power supply source Vddg the arrangement of the transistors means that the transistor 80 is turned on and the boosted power supply can be supplied to the output but at the same time the power supply Vddg is isolated from this output preventing any route for current from the boosted power supply Vbg to the power supply Vddg.

Figure 3:
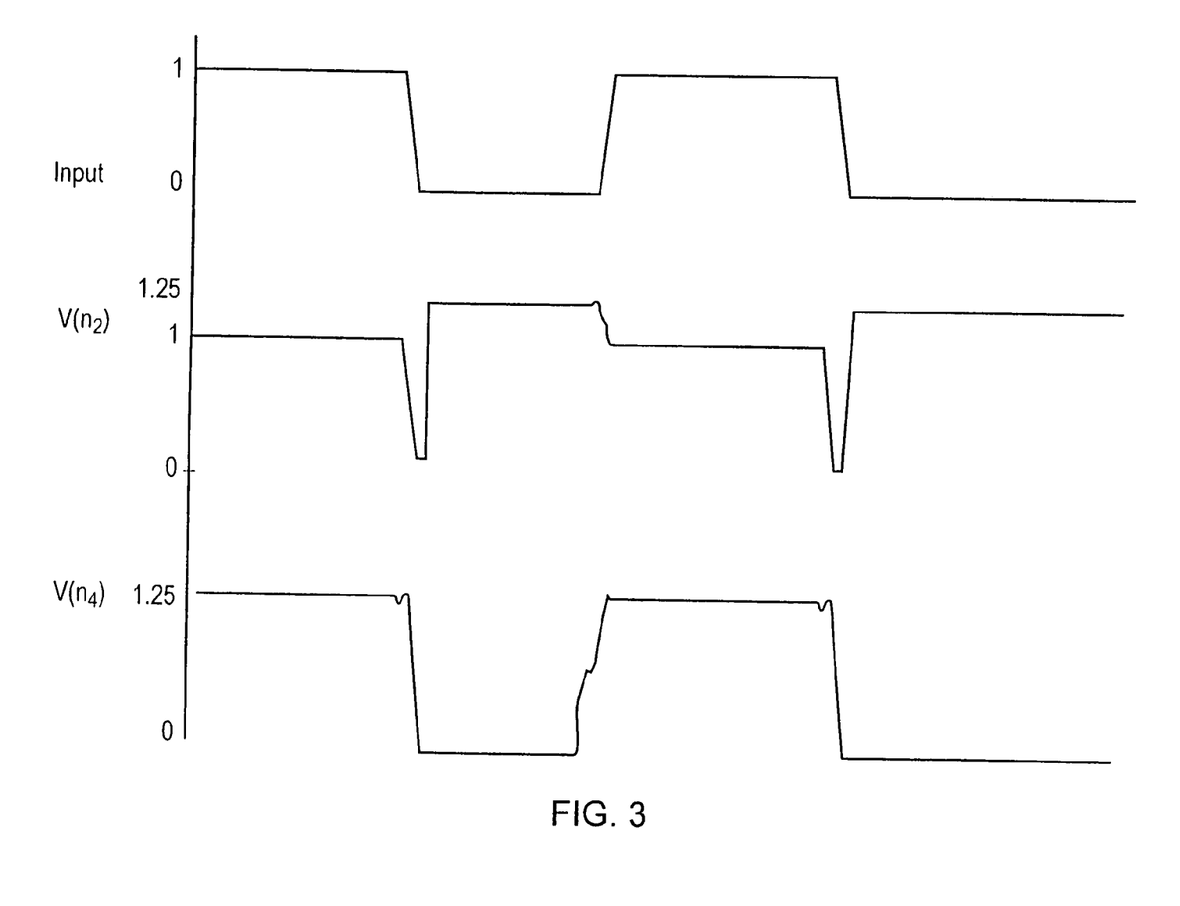
FIG. 3 shows a timing diagram illustrating how the voltage at various nodes within the circuit of FIG. 2 varies with variations within the input voltage.

FIG. 3 shows a timing diagram showing how the voltage at nodes n2 and n4 of the circuit of FIG. 2 vary with the input signal. Thus, when the input signal is high the voltage at node 2 is also high at one volt, the voltage of the supply line while the voltage at n4 is at the boosted 1.25 volts. This is because transistor 70 is on while transistor 80 is off. When the input voltage falls low then the voltage at node n2 falls too. This is in response to transistor 40 turning off. The voltage at node n2 being low causes transistor 60 to turn on. This is a large transistor designed to connect to the high power line Vddg and thus, it can carry a lot of current and the voltage level at the output signal therefore rises quickly to a 1. When it reaches a 1 then this acts to turn the NMOS transistor 90 on which transmits the 0 through to the gate of transistor 80 and turns it on, this then supplies the boosted voltage level to the output. This high level at the input to transistor 70 turns it off which in turn turns transistor 40 on making the voltage at n2 rise to the boosted voltage level of 1.25 volts and turns transistor 60 off thereby isolating the supply voltage Vddg from the supply voltage Vgb via the output line.

When the input voltage signal goes high again then the voltage at n2 drops to 1 volt from the 1' volt while the voltage at n4 rises to 1' as transistor 70 turns on.

Thus, the various transistors act to connect firstly the high voltage source Vddg to the output and then to connect the boosted high voltage source to the output while isolating the output from the high voltage source Vddg.

Figure 4:
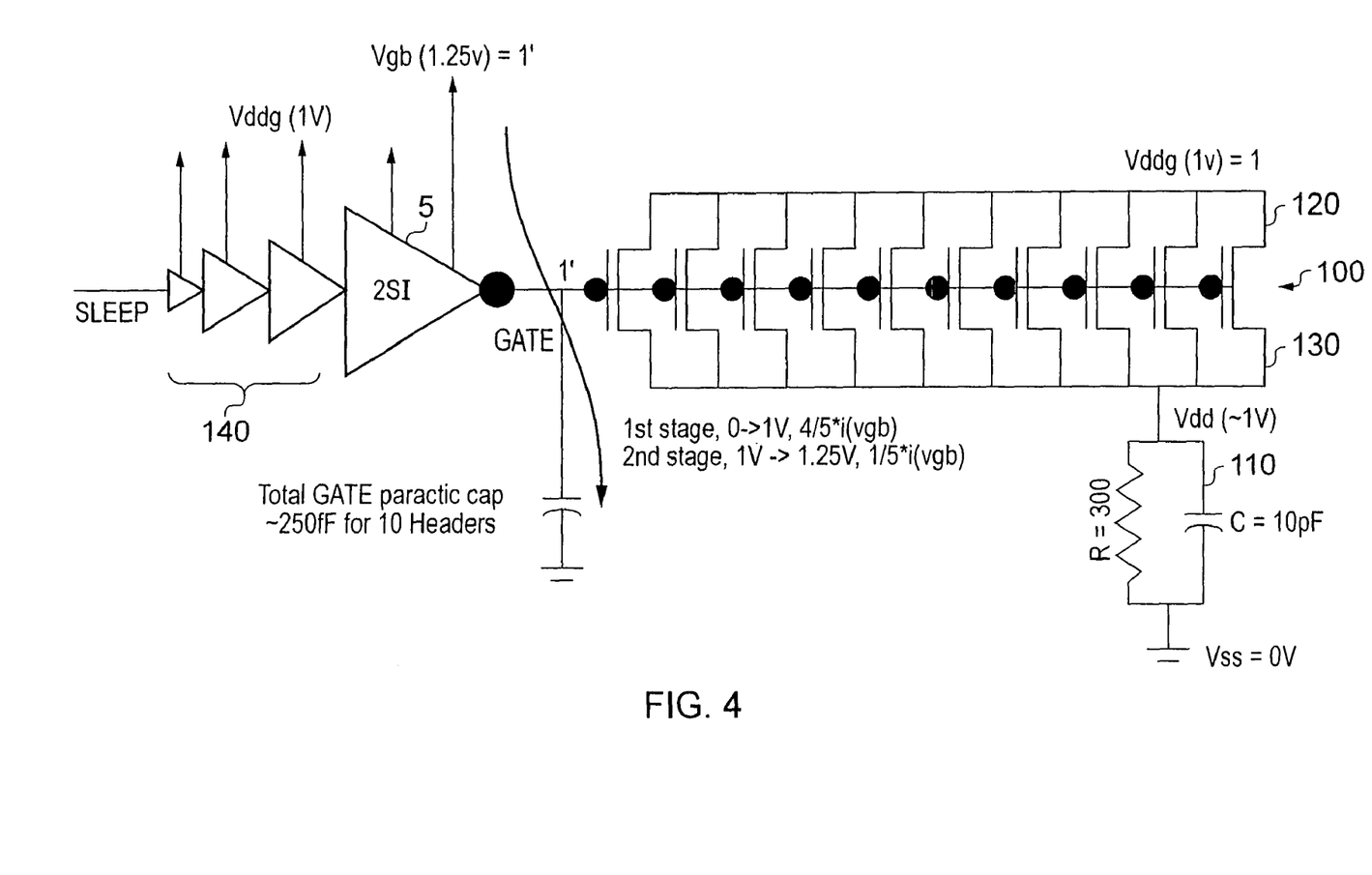
FIG. 4 shows the inverter of FIG. 1 in use controlling the header power control transistors in a circuit.

FIG. 4 shows a use of an inverter according to an embodiment of the present invention. In this embodiment, inverter 5 is used to control the header transistors 100 that act to gate processing circuitry 110. Thus, the high voltage rail 120 supplying Vddg is connected to the virtual power rail 130 via transistors 100 which are aligned in parallel in response to a signal output by the inverter 5. Thus, when a 0 is output these header transistors 100 are on and the virtual power rail 130 is at approximately Vddg. When a sleep signal indicating that the circuitry is to enter low power mode is received at inverter 5 then a high output signal is output which turns header transistors 100 off. Inverter 5 is a two-stage inverter as is described with respect to FIGS. 1 and 2. Thus, initially the voltage level rises to Vddg which is sufficient to turn the header transistors 100 off. It then rises further to the gate bias voltage of 1.25 volts which means that transistors 100 enter their super cut off state which reduces any leakage currents across these header transistors 100.

In this embodiment, a number of driver circuits 140 are shown connected to the three stage inverter 5. These circuits are there to introduce a delay to the switching on of the transistors. This is because many circuits have a large number of header transistors which are arranged in groups. If all the header transistors are turned on at the same time then there will be a large current peak and this will cause the supply voltage to fall and might cause some failure of the circuit if it falls beneath a critical value. Thus, the switching on of the circuits is arranged such that they do not all turn on together but are turned on with a slight delay between each. These driver circuits 140 are used to introduce the delay. There is no need to provide a delay when the circuit is switching off.

Figure 5:
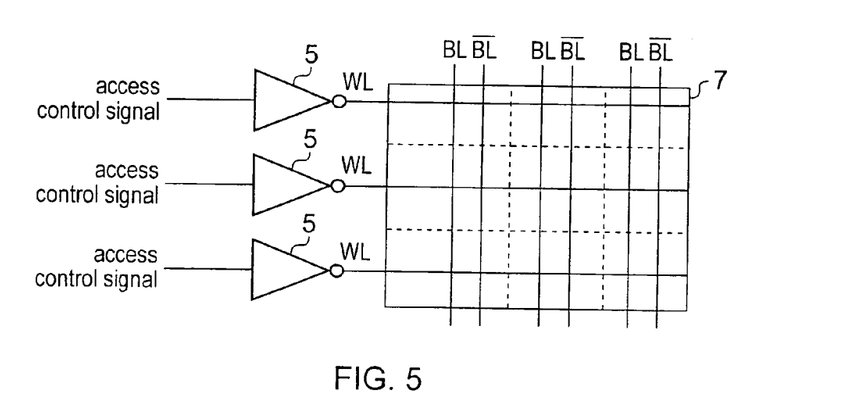
FIG. 5 shows the inverters of FIG. 1 in use providing a boosted wordline voltage in a memory cell.

FIG. 5 shows an alternative use of the voltage level shifting device according to an embodiment of the present invention. In this embodiment inverter 5 is used to boost the voltage on the word lines for accessing a memory cell 7. One problem with memory cells is that if they are to be robust with regard to data retention then they can be quite difficult to overwrite. Writing requires the state of the cells to flip. The cells are generally cross-coupled inverters and if they are stable to voltage fluctuations they do become difficult to overwrite. This problem has been addressed by providing a boost to the word line voltage during write which enables the cells to be flipped. Inverter 5 according to embodiments of the present invention is a convenient way of providing this boost to the word line in an area efficient manner.

Figure 6:
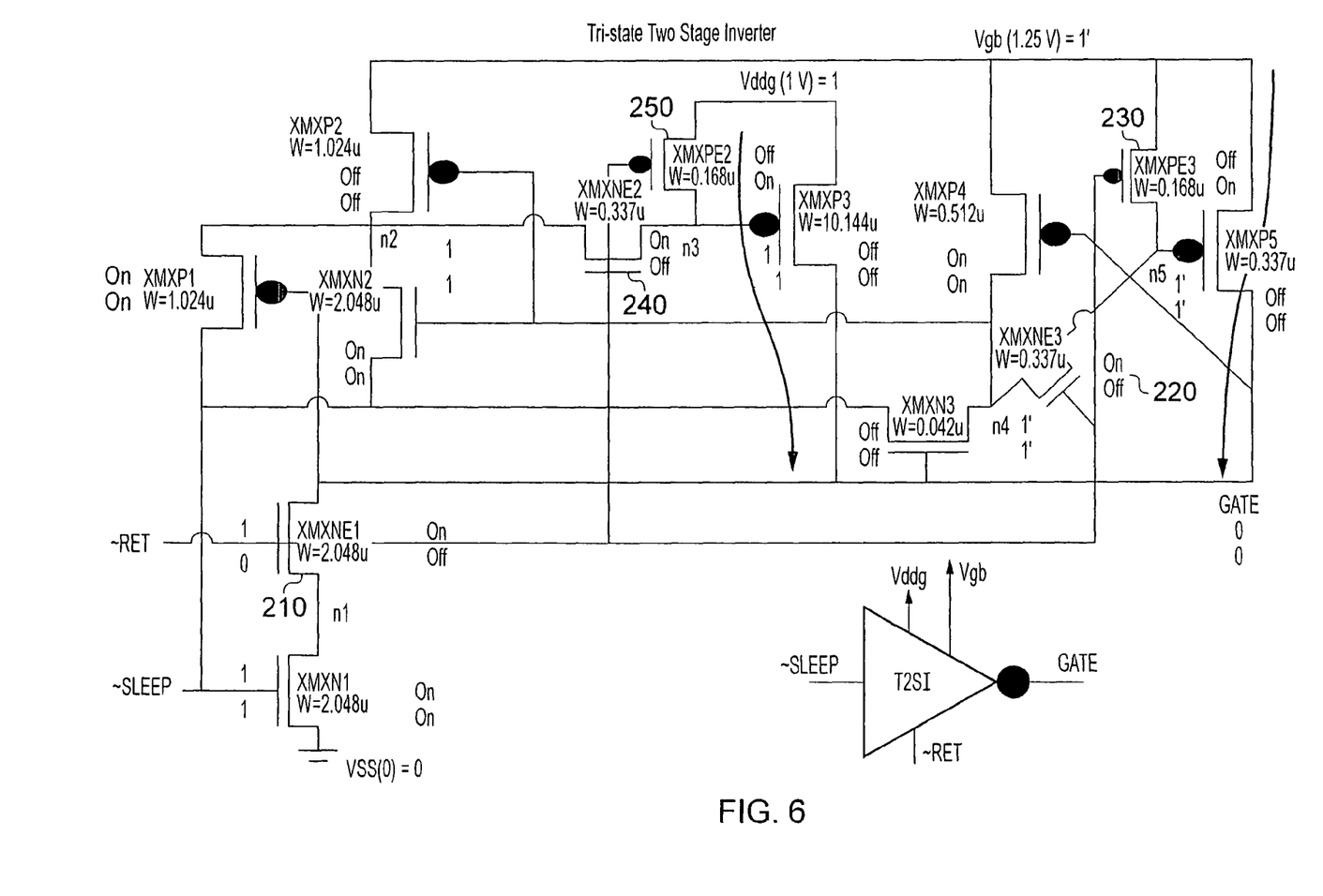
FIG. 6 shows a tristate inverter according to an embodiment of the present invention.

FIG. 6 shows a tristate two-stage inverter according to an embodiment of the present invention. Inverter 5 of FIGS. 1 to 4 has an output state of a 0 or of 1' Vbg. It may be convenient for the inverter to also have a tristate high impedance output in which the input signal is isolated from the output signal. This tristate three-stage inverter has additional transistors to the two-stage inverter of FIG. 2. These additional inverters comprise a transistor 210 for controlling the tristate output and transistors 220, 230, 240 and 250. These transistors help generate the high impedance state when the retention signal indicates that this sleep state is to be entered. Thus, this tristate two-stage inverter has three possible outputs, the tristate high impedance output, a 0 output and the, boosted voltage output.

Figure 7:
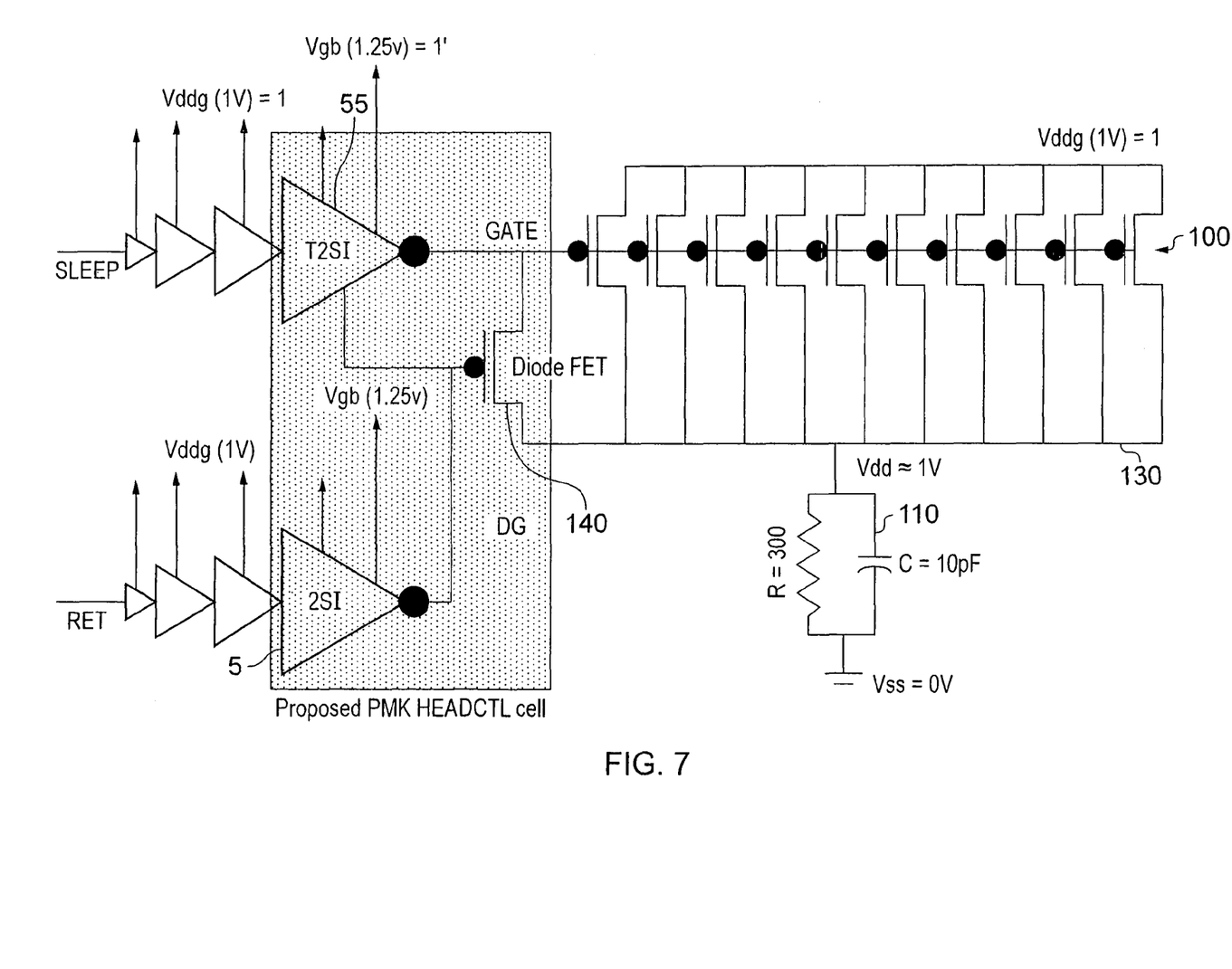
FIG. 7 shows the use of such a tristate inverter of FIG. 6 in controlling the header transistors in a processing circuit.

This can be used in a circuit shown in FIG. 7 for controlling header transistors 100. In this case, there is an additional diode connected transistor 140 that is arranged between the header transistors and that is used to generate the retention state. Thus, in this case transistors 100 and 140 can be used to generate three possible states, an on state when the circuitry 110 is powered, an off state when transistors 100 are turned off and no power is supplied to circuitry 110 and a retention state when a reduced voltage level is applied to virtual power rail 130 such that there is sufficient voltage to retain the state within circuitry 110 but there is a reduced voltage drop across this circuitry and thus, power leakage levels are lower.

When diode connected transistor 140 is on it provides a connection between the output of the header transistors 100 and their gates such that there is a voltage drop across them which is dependent on the threshold voltage of the header transistors 100. Thus, the output voltage on the virtual voltage rail is no longer Vddg but is Vddg minus the threshold voltage of these header transistors. This is the tristate state where the input signal input to tristate inverter 55 is isolated from its output which stops this output from competing with the voltage level at the source of the diode connected transistor 140. As in the embodiment of FIG. 4, the inverter 55 has the ability to output a boosted voltage level Vgb and thus, produce the super cut off state for header transistors 100. There is an additional Instate inverter 5 which is used to generate this boosted signal for the input to the diode connected transistor 140 and stop any leakage route through this transistor 140.

Figure 8:
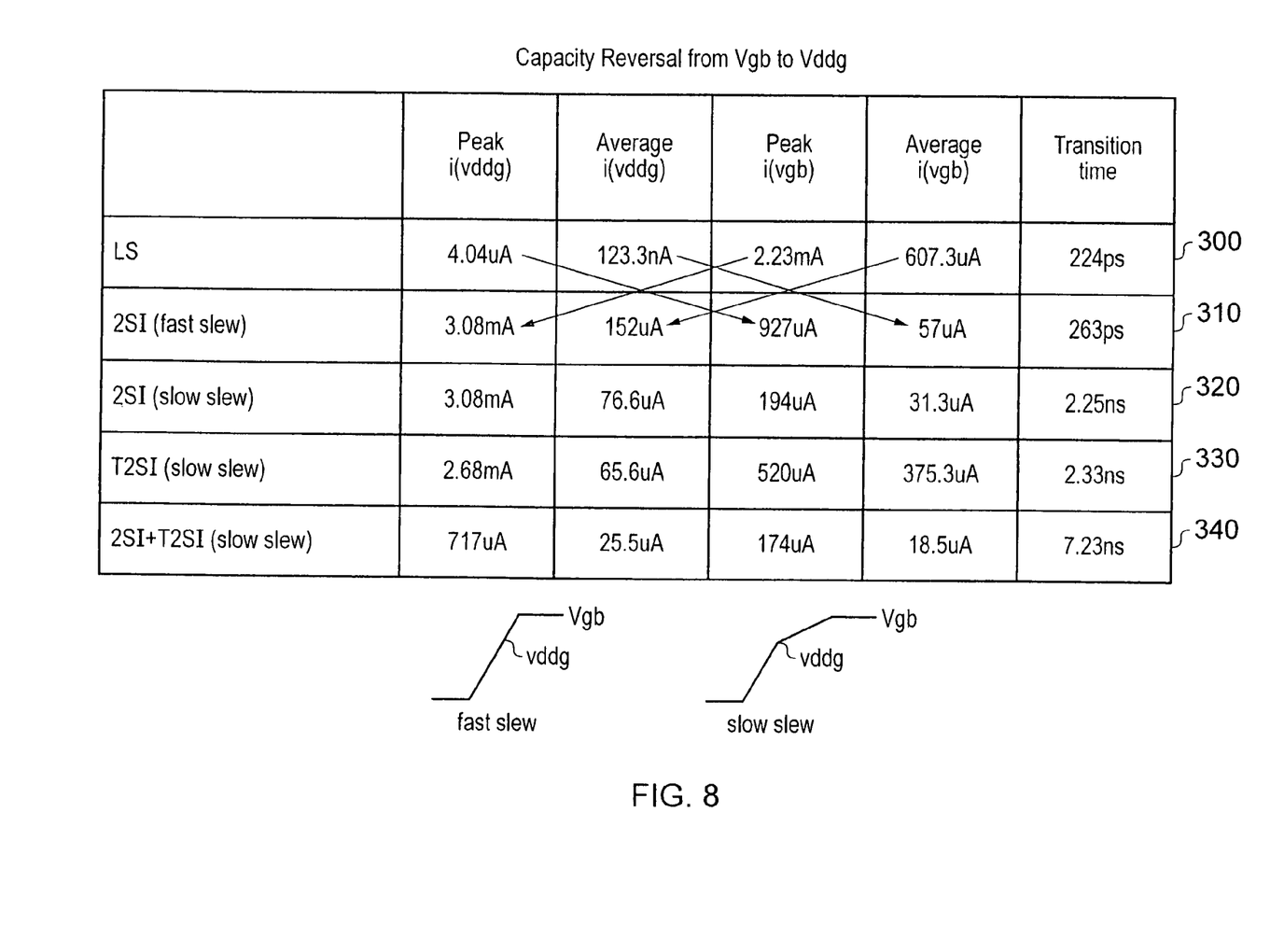
FIG. 8 gives examples of the current requirements of circuits of the prior art and embodiments of the present invention.

FIG. 8 shows some example of current flows of two-stage voltage level shifters according to embodiments of the present invention compared to a single stage voltage level shifter according to the prior art that simply uses the boosted voltage source for the complete transition. Row 300 relates to a circuit having a voltage level shifter of the prior art, 310 relates to the two-state inverter with a fast slew rate, 320 a two-stage inverter with a slow slate rate, 330 the tristate two-stage inverter with the slow slew rate and 340 the slow slew rate tristate arrangement shown in FIG. 7.

As was noted previously, the rate of change of voltage level from VDDG to the boosted level VGB can be slow as at this point the circuit is already turned off but is not in the super cut off state. Delaying entry into the super cut off state merely increases leakage currents without affecting operational performance and thus, in many cases is acceptable. Thus, it may be advantageous in some embodiments to select small transistors for the transistors that feed the boosted voltage level, i.e. transistors 70, 80 and 90 in FIG. 2. This will result in a slow slew rate rise from VDDG to VGB as is shown in the diagram at the bottom of FIG. 8. In other embodiments, it may be acceptable to have larger transistors at these points and thus, a fast slew rate can be obtained for this later portion of the transition.

In the prior art the peak current taken from the boosted voltage source is 2.23 milliamps, whilst the highest current taken from the boosted voltage source in any of the embodiments of the present invention is 927 micro amps. This is significantly lower. This is because the current for generating this change in voltage level is generated from the VDDG source. As this is required to power the rest of the circuitry it needs to be a large source and the grid connecting it to the circuitry is similarly large. Thus, in the prior art a grid and boosted power supply sufficient to supply a peak current of 2.23 milliamps is required, while embodiments of the current invention only require a peak current of 927 microamps, or if a slow slew rate is acceptable 174 Microamps.

The diagram also shows the difference in transition times and peak currents between the fast and the slow slew rates. These are quite significant and thus, in some embodiments where it is very important to have a small source the slow slew rates may prove to be advantageous.

Figure 9:
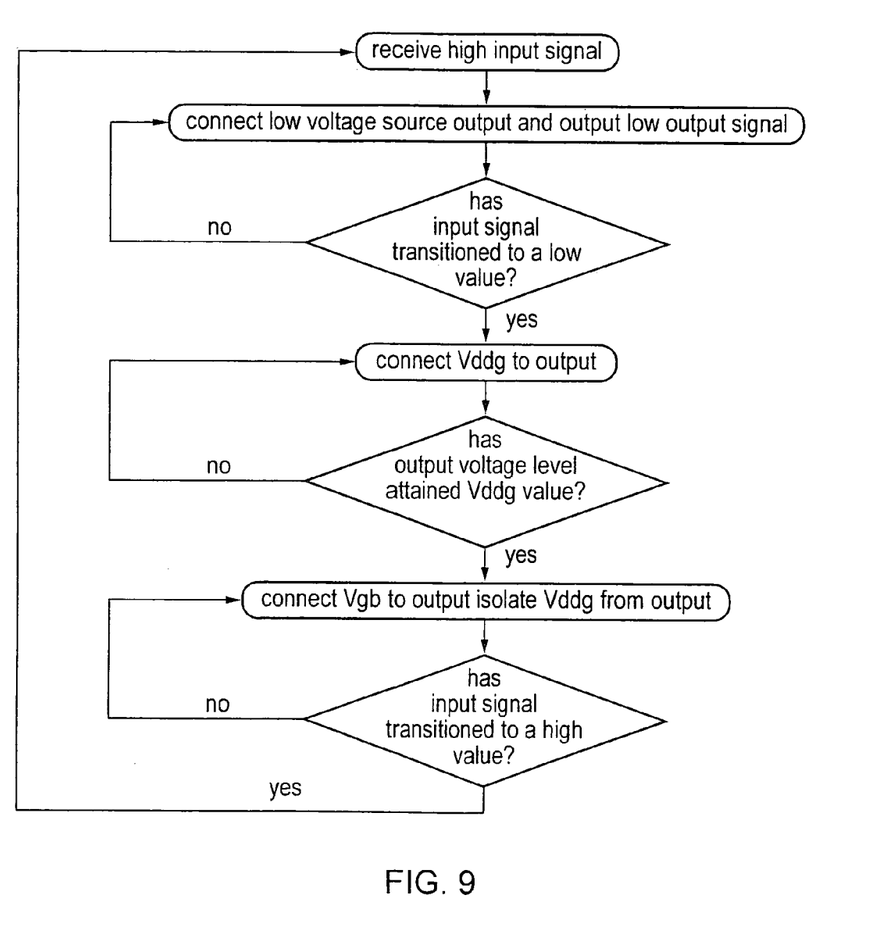
FIG. 9 shows a flow diagram illustrating a method according to an embodiment of the present invention.

FIG. 9 shows a flow diagram illustrating steps in a method according to an embodiment of the present invention. In this method a high input signal is initially received and in response to this the low voltage source is connected to the output and a low output signal is output. It is then determined if the input signal has transitioned to a low value. If it has the power supply VDDG is connected to the output and a high output signal is output. It is then determined if the output voltage has obtained this VDDG value. When it has the boosted output voltage is connected to the output and the VDDG output is isolated from the output and thus, a boosted value is output. It is then determined if the input signal has transitioned to a higher value. If it has then the sequence is started again.

It should be noted that although embodiments of the invention have been described with respect to providing a voltage level shift from a low level to a high level and then a boosted high level, it will be clear to a skilled person that the techniques of embodiments of the present invention could equally well be applied to shifting from a high level to a low level and then a boosted extra low level, for example from VDD to VSS to VSS'. Thus, in an embodiment corresponding to those of FIGS. 4 and 7 a voltage booster could be used where the power control transistors are footer NMOS transistors and they could be used to produce a voltage level that is boosted with respect to the low voltage level such that perhaps a negative voltage is applied to the gates of these footer transistors.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims. For example, various combinations of the features of the following dependent claims could be made with the features of the independent claims without departing from the scope of the present invention.

We claim:

1. A voltage level shifter for shifting an output signal from a first voltage level to a second voltage level and then to a further boosted second voltage level, said voltage level shifter comprising:
an input for receiving an input signal;

an output for outputting an output signal; a first power supply input for connecting to a first voltage source supplying said first voltage level;
a second power supply input for connecting to a second voltage source supplying said second voltage level;
a third power supply input for connecting to a third voltage source supplying said boosted second voltage level;
a first switch responsive to a first value of said input signal to connect said output to said first power supply input and responsive to a second value of said input signal to isolate said output from said first power supply input;
a second switch responsive to said second value of said input signal to connect said output to said second power supply input and responsive to said first value of said input signal to isolate said second power supply input from said output; and
further switches responsive to said output signal attaining a predetermined value to connect said third power supply input to said output, said further switches forming a portion of a feedback path for supplying a signal to control said second switch by overriding said second value supplied to said second switch such that said second switch is controlled to isolate said output signal from said second power supply input in response to said output signal attaining said predetermined value, such that said voltage level shifter is responsive to a predetermined change in said input signal to isolate said first power supply input from said output and to connect said second power supply input to said output and being responsive to said output signal attaining said predetermined value to connect said third power supply input to said output and to isolate said second power supply input from said output, wherein said second switch is substantially larger than any one of said further switches.

2. A voltage level shifter according to claim 1, wherein said predetermined value is substantially equal to said second voltage level.

3. A voltage level shifter according to claim 1, wherein said voltage level shifter comprises an inverter such that said predetermined change in said input signal triggering said output changing from said first voltage level to said second boosted voltage level comprises an input signal change from said second voltage level to said first voltage level.

4. A voltage level shifter according to claim 1, wherein said further switches are configured such that a rate of change of said output signal from said predetermined value to said second boosted voltage level is lower than a rate of change of said output voltage level from said first voltage level to said predetermined value.

5. A voltage level shifter for shifting an output signal from a first voltage level to a second voltage level and then to a further boosted second voltage level, said voltage level shifter comprising:
an input for receiving an input signal;
an output for outputting an output signal;
a first power supply input for connecting to a first voltage source supplying said first voltage level;
a second power supply input for connecting to a second voltage source supplying said second voltage level; and
a third power supply input for connecting to a third voltage source supplying said boosted second voltage level;
said voltage level shifter being responsive to a predetermined change in said input signal to isolate said first power supply input from said output and to connect said second power supply input to said output and being responsive to said output signal attaining a predetermined value to connect said third power supply input to said output and to isolate said second power supply input from said output, said voltage level shifter comprising a tristate voltage level shifter, said tristate voltage level shifter being configured to output three different output signals, a high impedance tristate output signal isolating said input signal from said output signal, said first voltage level and said second boosted voltage level, said voltage level shifter comprising a further input for receiving a tristate control signal, said voltage level shifter being responsive to said tristate control signal having said predetermined value to generate said tristate output signal by isolating said input from said output.

6. An apparatus comprising at least one voltage level shifter according to claim 1, said apparatus further comprising:
first, second and third voltage supplies configured to supply said first voltage level, said second voltage level and said boosted second voltage level respectively;
circuitry powered by a voltage difference between said first and second voltage supplies; wherein
said third voltage supply is configured to supply said second boosted voltage level as a biasing voltage level via said at least one voltage level shifter to at least one component within said apparatus; wherein
said third voltage supply is a voltage supply occupying a small circuit area compared to at least one of said first and said second voltage supply.

7. An apparatus according to claim 6, said apparatus comprising a data processing apparatus comprising processing circuitry powered by a voltage difference between said first and second voltage supplies and further comprising:
at least one power control switch arranged between one of said first and second voltage supplies and said processing circuitry, said at least one power control switch being controlled by said output signal from said at least one voltage level shifter, said at least one power control switch being responsive to said at least one voltage level shifter outputting:
said first voltage level to connect said one of said first and second voltage supplies to said processing circuitry;
said second voltage level to isolate said one of said first and second voltage supplies from said processing circuitry; and
said boosted second voltage level to isolate said one of said first and second voltage supplies from said processing circuitry and provide a reduced leakage current through said power control switches.

8. A data processing apparatus according to claim 7, wherein said at least one voltage level shifter comprises a tristate voltage level shifter;
said tristate voltage level shifter being configured to output three different output signals, a high impedance tristate output signal isolating said input signal from said output signal, said first voltage level and said second boosted voltage level, said voltage level shifter comprising a further input for receiving a tristate control signal;
said tristate voltage level shifter being responsive to said tristate control signal having said predetermined value to generate said tristate output signal by isolating said input from said output; said data processing apparatus further comprising:
a retention mode switch controlled by said tristate control signal and connected between an output of said at least one power control switch and a control input of said at least one power control switch, wherein in response to said tristate control signal having said predetermined value, said tristate voltage level shifter outputs said high impedance tristate output and said tristate switch is turned on such that said output of said at least one power control switch is connected to said control input and a portion of said voltage difference supplied to said processing circuitry drops across said at least one power control switch.

9. A data processing apparatus according to claim 7, wherein said data processing apparatus comprises a SCMOS apparatus.

10. An apparatus according to claim 6, said apparatus comprising a semiconductor memory storage device comprising:
a plurality of storage cells for storing data;
at least two access control lines each for controlling access to at least one of said plurality of storage cells;
wherein in response to an access control signal indicating a selected cell to be accessed, said at least one voltage level shifter is controlled to output said boosted second voltage level to one of said access control lines to provide a boost to a voltage level on said access control line.

11. A method of shifting an output signal from a first voltage level to a second voltage level and then voltage shifting said output signal to a further boosted second voltage level, said method comprising the steps of:
connecting a first voltage source supplying said first voltage level to a first power supply input;
connecting a second voltage source supplying said second voltage level to a second power supply input; and
connecting a third voltage source supplying said boosted second voltage level to a third power supply input;
receiving an input signal having a first value;
connecting, in response to receipt of said input signal, said first voltage source to an output via a first switch in order to generate said output signal;
in response to said input signal changing from said first value to a second value, isolating said first power supply input from said output via said first switch and connecting said second power supply input to said output via a second switch; and
in response to said output signal attaining a predetermined value, connecting said third power supply input to said output via further switches and isolating said second power supply input from said output, said further switches forming a portion of a feedback path for supplying a signal to control said second switch by overriding said second value supplied to said second switch such that said second switch is controlled to isolate said output signal from said second power supply input in response to said output signal attaining said predetermined value, wherein said second switch is substantially larger than any one of said further switches.

12. A method according to claim 11, wherein said predetermined value is substantially equal to said second voltage level.

13. A method according to claim 11, wherein said voltage level shifter comprises an inverter such that said first value of said input signal comprises said second voltage level and said second value of said input signal comprises said first voltage level.

14. A voltage shifting means for shifting an output signal from a first voltage level to a second voltage level and then to a further boosted second voltage level, said voltage shifting means comprising:

an input means for receiving an input signal;
an output means for outputting an output signal a first power supply input means for connecting to a first voltage source supplying said first voltage level;
a second power supply input means for connecting to a second voltage source supplying said second voltage level;
a third power supply input means for connecting to a third voltage source supplying said boosted second voltage level;
a first switching means, responsive to a first value of said input signal, for connecting said output to said first power supply input means and, responsive to a second value of said input signal, for isolating said output from said first power supply input means;
a second switching means, responsive to said second value of said input signal, for connecting said output to said second power supply input means and, responsive to said first value of said input signal, for isolating said second power supply input from said output means; and
further switching means, responsive to said output signal attaining a predetermined value, for connecting said third power supply input means to said output means, said further switching means forming a portion of a feedback path for supplying a signal to control said second switching means by overriding said second value supplied to said second switching means such that said second switching means is controlled to isolate said output signal from said second power supply input means in response to said output signal attaining said predetermined value, wherein said voltage shifting means is for isolating said first voltage source from said output and for connecting said second power supply input means to said output in response to a predetermined change in said input signal and for connecting said third power supply input means to said output means and for isolating said second power supply input means from said output means in response to said output signal attaining said predetermined value, wherein said second switching means is substantially larger than any one of said further switching means.

15. An apparatus comprising at least one voltage shifting means according to claim 14, said apparatus further comprising:
wherein said first voltage source comprises a first means for supplying said first voltage level;
wherein said second voltage source comprises a second means for supplying said second voltage level and
wherein said third voltage source comprises a third means for supplying said boosted second voltage level, wherein circuitry powered by a voltage difference between said first and second means; wherein said third means is for supplying said second boosted voltage level as a biasing voltage level via said at least one voltage shifting means to at least one component within said apparatus, and wherein said third means occupies a small circuit area as compared to at least one of said first and said second means.

* * * * *